United States Patent
Zahr

[11] Patent Number: 5,413,753
[45] Date of Patent: May 9, 1995

[54] METHOD FOR DISPERSION SPINNING OF SHEATHED ROD-IN-TUBE SUPERCONDUCTING COMPOSITES

[75] Inventor: George E. Zahr, Glen Mills, Pa.

[73] Assignee: E. I. Du Pont de Nemours and Company, Wilmington, Del.

[21] Appl. No.: 123,620

[22] Filed: Sep. 17, 1993

[51] Int. Cl.⁶ .......................... B22F 5/00; H01B 13/00
[52] U.S. Cl. ........................ 419/36; 505/430; 419/5; 419/6; 419/7; 419/10; 419/19; 419/21; 419/22; 419/32
[58] Field of Search ........................ 419/5, 6, 7, 10, 19, 419/21, 22, 30, 36; 505/1, 430

[56] References Cited

U.S. PATENT DOCUMENTS

| | | | |
|---|---|---|---|
| 4,814,370 | 3/1989 | Kramer et al. | 524/391 |
| 4,882,110 | 11/1989 | Kramer et al. | 264/63 |
| 4,929,594 | 5/1990 | Gopalakrishnan et al. | 505/1 |
| 4,980,964 | 1/1991 | Boeke | 29/599 |
| 5,036,043 | 7/1991 | Subramanian | 505/1 |
| 5,045,527 | 9/1991 | Ikeno et al. | 505/1 |
| 5,192,739 | 3/1993 | Lay | 505/1 |
| 5,242,896 | 9/1993 | Matsubara et al. | 505/1 |
| 5,244,876 | 9/1993 | Priester et al. | 505/1 |

FOREIGN PATENT DOCUMENTS

| | | | |
|---|---|---|---|
| 292385 | 11/1988 | European Pat. Off. | H01L 39/24 |
| 306034 | 3/1989 | European Pat. Off. | C04B 35/00 |
| 445832 | 11/1991 | European Pat. Off. | C04B 41/87 |

OTHER PUBLICATIONS

Wu et al., Phys. Rev. Lett 58, 908–910 (1987).
Subramanian et al., Science 239, 1015–1017 (1988).
Song et al., J. Mater. Res., vol. 5, No. 1, 27–32 (1990).
Pierre et al., J. of Appl. Phys., vol. 68, No. 5, 2296–2303 (1990).
Weddell, J. K., J. Text. Inst., 81 No. 4, 333–359.
Sakai et al., J. Ceramic Society of Japan, vol. 100, No. 2, 117–122, (Feb. 1992).
Zhuang et al., Japanese J. Applied Physics, vol. 28, No. 10, L1805–L1808 (Oct. 1989).

Primary Examiner—Donald P. Walsh
Assistant Examiner—John N. Greaves

[57] ABSTRACT

Methods of forming composite articles of superconducting materials and metal at ambient temperature by applying a mixture of metal and binder to a ceramic oxide preform to yield a coated preform which is then heat treated to provide composite articles of superconducting ceramic and metal.

7 Claims, 1 Drawing Sheet

METHOD FOR DISPERSION SPINNING OF SHEATHED ROD-IN-TUBE SUPERCONDUCTING COMPOSITES

FIELD OF THE INVENTION

This invention is generally directed to manufacture of composite materials. More particularly, this invention is directed to manufacture of superconducting wires.

BACKGROUND OF THE INVENTION

High temperature superconductors, that is, superconductors that have a critical temperature on the order of 90° K., are disclosed by Wu et al , Phys. Rev. Lett. 58, 908–910 (1987). These high temperature superconductors are based on the Y—Ba—Cu—O system. U.S. Pat. No. 4,929,594 discloses a superconducting composition comprised of a crystalline phase of the formula $Tl_2Ba_2CuO_{6+x}$, wherein x is from 0 to about 0.5, that has a temperature above 90° K. Subramanian et al., Science 239, 1015–1017 (1988), disclose materials of the formula $Bi_2Sr_{3-x}Ca_xCu_2O_{8-y}$ which show a resistivity drop at about 116° K. and apparent zero resistivity at 91° K.

A wide variety of applications for superconducting materials has developed. These applications include power transmission and high-speed computer electronics. Superconductor materials have been used primarily in the form of sintered articles since elongated articles such as wire are difficult to form and have non-uniform properties. Known technologies of forming super-conducting wire, as shown in U.S. Pat. No. 4,980,964, employ powder-in-tube technology. This technology entails filling a metal tube with a powder of super-conductive material, sealing the tube, and cold drawing the sealed metal tube until a predetermined wire size is achieved. The drawn wire is heat treated to assure crystallinity in the superconductor material. This technology, however, produces wire of short lengths and nonuniform properties.

An improvement over powder-in-tube technology is described in European Patent Application publication number 0 292 385. This publication describes manufacturing an elongated superconducting composite by kneading a mixture of powder of superconducting oxide with a binder while shaping the resulting kneaded paste into an elongated pre-form by an extruder or other device. The pre-form is heated continuously to remove the binder. The pre-form then is wrapped with a metallic sheet and sintered at elevated temperatures. While this method results in longer and somewhat more uniform superconducting wire, this method can change the phase content of the resulting sintered ceramic and thus sacrifice superconducting properties.

European Patent Application 306,034 shows a method of forming superconducting ceramics which have a metal cladding thereon. In an embodiment, preforms of plastic compositions of polymer, plasticizer, and ceramic material are bonded prior to firing with a blend of metal, polymer and plasticizer to yield a metal clad sintered ceramic article upon firing. This method, however, is susceptible to undesirable leaching of materials between superconducting material and the metal coating. Also this method uses less than 10% of polymer and a plasticizer causing a high void content in the superconducting oxide and thus lower performance.

A need therefore exists for processes for manufacturing elongated superconducting ceramic, metal clad articles useful for wire application which provides increased lengths and uniformity, and high density ceramic superconductors but which avoids the deficiencies of the prior art methods.

SUMMARY OF THE INVENTION

This invention provides a method of manufacture of composite articles of ceramic bearing a metal coating comprising, forming at ambient temperature a first mixture of ceramic powder and a first solution of organic binder solvent, and optional surfactant into an elongated ceramic preform, coating said preform at ambient temperature with a second mixture of metal and a second solution of organic binder solvent and optional surfactant that employs a solvent other than a solvent for the binder employed in said first solution of organic binder to provide a coated ceramic preform, and firing said coated ceramic preform to yield a composite article of ceramic bearing a uniform metal coating thereon.

DETAILED DESCRIPTION OF THE INVENTION

Figure 1:
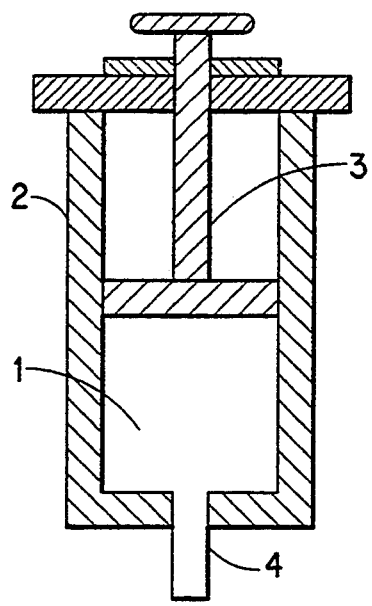
FIG. 1 is a schematic drawing of a spin cell employed to form ceramic fibers for subsequent coating with metal.

Superconducting materials useful in the practice of this invention include ceramic materials that have a critical temperature ($T_c$), that is, the temperature at which resistivity drops to substantially zero, of preferably more than about 77° K. Such materials are described, for example, in Song et al., J. Mater. Res., Vol. 5, No. 1, 27–32 (1990) and in Pierre et al., J. of Appl. Phys., 68, 2296–2303 (1990). Ceramic materials that have a $T_c > 77°$ K. include ceramic oxides from the Y—Ba—Cu—O system including $Y_1Ba_2Cu_3O$; the Tl—Ba—Cu—O system such as $Tl_2Ba_2CuO_{6+x}$ wherein x=0 to 0.5; from the Bi—Sr—Ca—Cu—O system such as $Bi_2Sr_{3-x}Ca_xCu_2O_{8-y}$ where x=0.4 to 0.9 and $0 < y < 1$; and from the Bi—Pb—Sr—Ca—Cu—O system such as $Bi_{1.6}Pb_{0.4}Sr_{1.6}Ca_{2.0}Cu_{2.8}O_{9.2+x}$ and $Bi_{1.8}Pb_{0.4}Sr_{2.0}Ca_{2.2}Cu_{3.0}O_{10.3+x}$, where x=0.1 to 0.5.

Generally, the superconducting wire material provided by the invention can be made at ambient temperature by mixing a solution of organic binder with the superconducting ceramic material. The resulting mixture of superconducting ceramic and binder is shaped at ambient temperature into preforms which are coated at ambient temperature with a mixture of metal and a solution of binder to provide a superconducting ceramic-metal composite. The solvent employed in binder solutions of the mixture of metal and binder is distinct from the solvent employed in the binder used for the ceramic. Typically, either solution or vapor deposition methods may be employed to apply the metal coating to the ceramic metal composite. The metal coated ceramic is heat treated to remove organic binders to yield an elongated metal coated superconducting product.

Generally, commercially available organic binders or mixtures thereof may be employed with both the ceramic and the metallic materials. Preferably, however, the organic binders employed burn off without yielding any residue. Organic binders useful to form superconducting ceramic, metal clad articles in accordance with this invention may include cellulose acetate, cellulose acetate butyrate, poly(vinyl alcohol), poly (ethylene oxide), poly (vinyl butyral), poly (methyl methacrylic acid), poly (methyl methacrylate), methyl cellulose, poly (isobutylene), and poly (propylene carbonate), preferably polyethylene oxide; most preferably poly(propylene carbonate). Preferably, substantially the same organic binders are employed with both the ceramic oxide and the metal powders. Different binders, however, may be employed between the ceramic powder and the metal coating provided that the binders dissolve in different solvents.

The amount of binder in the mixture of ceramic and binder, based on the total volume of the binder and ceramic material, but excluding any solvent, may vary from 20% to 80%. Preferably, the amount of binder can vary from 30% to 45% by volume (approximately 10-15% by weight depending on the density of the binder). Similarly, the amount of binder in the mixture of binder and metal may vary from 20% to 80% by volume. Preferably, the volume percent of binder in the mixture of binder and metal may vary from 30% to 45% (approximately 10-15% by weight depending on the density of the binder).

In order to provide an intimate mixture of organic binder either with the ceramic or metal powder, the binder is mixed with an organic solvent that is at least a partial solvent for the binder. Solvents useful in this invention include both polar and nonpolar solvents. Useful solvents, therefore, include ethylene glycol, methyl ethyl ketone, cyclohexanone, acetone, ethyl acetate, methanol, glycerol and water, preferably, methyl ethyl ketone. Solvents employed for the organic binder that is admixed with the metal powder, however, are not solvents for the organic binder employed with the ceramic oxide. The solvent chosen should at least partially dissolve the binder, e.g., polar solvents should be employed for polar binders.

Generally, surfactants may be incorporated with the mixture of solvent and binder which are employed with the ceramic and metal powders. Surfactants which may be employed in this invention include long chain organic acids, such as oleic acid, and polyacrylic acid, fatty acid esters, and fatty acid alkoxylates, preferably fatty acid alkoxylates.

The metal powder employed to coat the ceramic preform may include ductile conducting metals. Suitable metals include silver, gold, platinum, copper, or mixtures thereof, preferably silver.

Composite articles of superconducting ceramic powder and organic binder which are coated with metal prior to heat treating readily can be formed by known techniques for manufacturing continuous ceramic fibers. See, for example, Weddell, J. Text. Inst., 1990, 81 No. 4, pp. 333-359. Preferably, the composite articles are manufactured in accordance with the method of FIG. 1.

Referring to FIG. 1, a mixture 1 of ceramic powder and organic binder is placed into spin cell 2. Mixture 1 is pressed by piston 3 for extrusion through nozzle 4 to provide continuous elongated strip (not shown). The strip can be collected by winding onto a spool or otherwise deposited in an elongated container (not shown).

Figure 2:
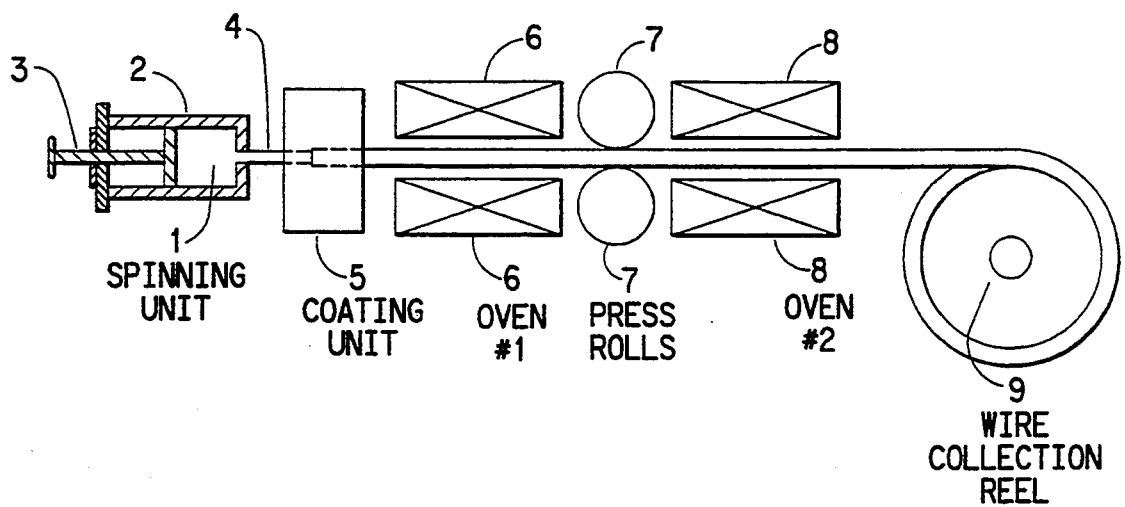
FIG. 2 is a schematic drawing of an apparatus for producing metal coated superconducting ceramic wire.

FIG. 2 illustrates an apparatus for performing the process of the invention in a continuous manner. As shown in FIG. 2, the ceramic organic binder mixture 1 is placed into spin cell 2 and extruded through nozzle 4 by piston 3 to provide at least one ceramic fiber. The fiber is passed to coating unit 5 to apply a coating of a mixture of metal and organic binder to the fiber. Coating unit 5 can be any commercially available coating unit such as an electric wire coater or a fiber reinforced plastic tow prepreger made by Cincinnati Milicron.

Generally, the coating of metal and organic binder may be applied to ceramic fiber in a wide range of thicknesses provided that all the ceramic fibers are coated. The thickness of metal coating may vary from $20 \times 10^{-6}$ m to $2 \times 10^{-3}$ m, preferably, $2 \times 10^{-4}$ m. After the metal coating has been applied to fiber, the coated fiber is passed through oven 6 to burn off the organic binders, crystallize the ceramic, and to densify the metal coating. Generally, the heat treatment employed in oven 6 will vary with the specific composition of binder, ceramic material, and metal. Specific heat treatment temperatures, atmospheres, and times can readily be determined in accordance with well known procedures to provide the desired superconducting phase of the ceramic oxide material. The density of the ceramic superconductor component of the wire after firing should be as high as possible and at least above 4.00 gms/cc and preferably above 5 gms/cc. The theoretical limit for the density is about 6.5 gms/cc depending on the exact composition and phase.

The resultant, metal clad, superconducting ceramic fibers may be employed directly in applications such as magnets, powerlines, etc. Alternatively, the metal clad, superconducting fibers, may be passed through press rolls, plates, or dies 7 to further densify the fiber and further eliminate any remaining pores. In that event, the densified fibers then again are passed through a second oven 8 where they are further heat treated to enhance the current carrying capability of the fiber. The resulting fibers then may be collected by a collecting means such as spool 9 or a similar device.

Figure 3:
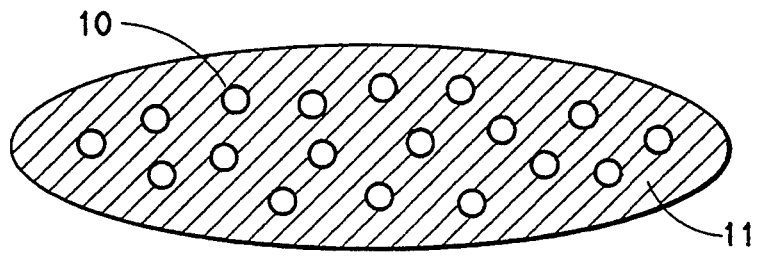
FIG. 3 is a schematic cross sectional view of a superconducting wire in accordance with this invention.

The metal coated, superconducting ceramic fibers of the invention can be formed into a variety of configurations where either a single fiber or a plurality of fibers of superconducting ceramic fibers are embedded in or are coated by metal. Fibers can be round, elliptical or rectangular. FIG. 3 shows a cross-sectional view of an article wherein a plurality of ceramic fibers 10 are combined into a bundle that is coated by metal 11.

The following non-limiting example illustrates the invention.

EXAMPLE 1

PREPARATION OF MIXTURES OF CERAMICS AND BINDERS

A mixture of ceramic oxide and binder is prepared at ambient temperature as follows: In a first container, a dispersion of oxide powder is prepared by mixing 10 g of $Bi_{1.6}Pb_{0.4}Sr_{1.6}Ca_{2.0}Cu_{2.8}O$ powder in 50 ml of methyl ethyl ketone. Two drops of a commercially available surfactant, Sotex CW (Morton Chemical) is thoroughly mixed with the dispersion. In a second container, a solution of 1.4 g of poly(propylene carbonate) binder in 20 ml of methyl ethyl ketone is made. This solution is mixed with the dispersion of the oxide powder. The methyl ethyl ketone is partially evaporated by heating until the mixture forms a gummy paste.

FORMING ELONGATED FIBERS AT AMBIENT TEMPERATURE

The gummy paste formed above is inserted into a conventional stainless steel spin cell that has an inside diameter of ½ inch, as schematically shown in FIG. 1. A piston is inserted into the spin cell to extrude the paste, and the spin cell is placed into a conventional spin unit. A spinneret is added to the spin cell to enable formation of fibers. The speed of the spin unit is adjusted to provide fibers from the spinneret. When spinnerets with openings of less than ⅛-inch diameter are employed, the extruded fibers are collected onto a 6-inch diameter bobbin. When larger hole size spinnerets are used, the extruded fibers may be collected onto a tray. In either case, the collected fibers are dried at room temperature.

PREPARATION OF METAL COATED CERAMICS

A silver paste for coating the ceramic fibers formed above is prepared at ambient temperature by mixing 2.0 g of commercially available silver powder, 0.24 g of poly(ethylene oxide) of an average molecular weight of about 600,000, and 5 ml of methanol.

The extruded ceramic fibers prepared above are uniformly coated at ambient temperature with the silver paste by dipping the ceramic fibers in the silver paste and evaporating the solvent.

HEAT TREATMENT AND FORMATION OF METAL-COATED, COMPOSITE SUPERCONDUCTING WIRE

The metal coated ceramic fibers prepared above are heated in air to remove the organic binder: starting at 25° C. the temperature is increased at the rate of 3° C. per minute to 520° C. whereupon the temperature is raised to 580° C. over 5 hours. The temperature then is lowered to 520° C. over 5 hours and further reduced at 3° C. per minute to 120° C. The heat treated material then is pressed between two metal plates to form a metal coated, composite superconducting ceramic wire. The heat treated and pressed wire then is recoated by dipping in a silver paste to seal any possible openings in the first silver coating. The recoated fiber again is heat treated in air under the low temperature cycle initially used to remove the organic binders. The resulting metal coated ceramic wire is again pressed as above. The resulting wire then is heated to drive off any remaining organic binder from the oxide powder and silver paste to form a silver coated superconducting ceramic of $Bi_{1.6}Pb_{0.4}Sr_{1.6}Ca_{2.0}Cu_{2.8}O$. The heat treatment is performed in an atmosphere of 7% oxygen and 93% nitrogen by increasing the temperature from 25° to 842° C. at a rate of 3° C. per minute and holding at 842° C. for 25 hours. The temperature then is lowered to 120° C. at 3° C. per minute.

What is claimed is:

1. A method of manufacture of composite articles of ceramic bearing a metal coating comprising, forming at ambient temperature a first mixture of ceramic powder and a first solution consisting of organic binder, solvent, and optional surfactant into an elongated ceramic perform, coating said preform at ambient temperature with a second mixture of metal and a second solution consisting of organic binder, solvent and optional surfactant that employs a solvent other than a solvent for the binder employed in said first solution to provide a coated ceramic preform, wherein said organic binders are independently selected from the group consisting of cellulose acetate, cellulose acetate butyrate, poly(ethylene oxide), poly(methyl methacrylic acid), poly(methyl methacrylate), methyl cellulose, poly(isobutylene), and poly(propylene carbonate), and firing said coated ceramic preform to yield a composite article of ceramic bearing a uniform metal coating thereon.

2. The method of claim 1 wherein said ceramic is a superconducting ceramic oxide selected from the group consisting of $Bi_{1.6}Pb_{0.4}Sr_{1.6}Ca_{2.0}Cu_{2.8}O_{9.2+x}$ and $Bi_{1.8}Pb_{0.4}Sr_{2.0}Ca_{2.2}Cu_{3.0}O_{10.3+x}$, wherein x is 0.1 to 0.5, and said metal is selected from the group consisting of silver, gold, platinum, copper, or mixtures thereof.

3. The method of claim 1 or 2 wherein said firing is at a temperature of less than 850° C.

4. The method of claim 2 wherein said ceramic is $Bi_{1.6}Pb_{0.4}Sr_{1.6}Ca_{2.0}Cu_{2.8}O_{9.2+x}$ wherein x is 0.1 to 0.5, and said metal is silver.

5. The method of claim 2 wherein said ceramic is $Bi_{1.8}Pb_{0.4}Sr_{2.0}Ca_{2.2}Cu_{3.0}O_{10.3+x}$ wherein x is 0.1 to 0.5.

6. The method of claim 1 or 2 wherein said organic binder is at least 10% by volume in each of said first and second mixtures.

7. The method of claim 4 or 5 wherein said metal is silver and the binder of the first solution and the binder of the second solution are each poly(propylene carbonate).

* * * * *